(12) United States Patent
Kim et al.

(10) Patent No.: US 9,385,077 B2
(45) Date of Patent: Jul. 5, 2016

(54) INTEGRATED DEVICE COMPRISING COAXIAL INTERCONNECT

(71) Applicant: QUALCOMM Incorporated, San Diego, CA (US)

(72) Inventors: Dong Wook Kim, San Diego, CA (US); Young Kyu Song, San Diego, CA (US); Kyu-Pyung Hwang, San Diego, CA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 14/329,646

(22) Filed: Jul. 11, 2014

(65) Prior Publication Data

US 2016/0013125 A1 Jan. 14, 2016

(51) Int. Cl.
H01L 21/44 (2006.01)
H01L 23/498 (2006.01)
H01L 21/48 (2006.01)
H05K 1/02 (2006.01)
(Continued)

(52) U.S. Cl.
CPC ...... *H01L 23/49838* (2013.01); *H01L 21/4853* (2013.01); *H01L 23/49811* (2013.01); *H05K 1/0298* (2013.01); *H05K 3/284* (2013.01); *H05K 3/46* (2013.01); *H01L 2224/16225* (2013.01); *H01L 2924/15311* (2013.01); *H01L 2924/19107* (2013.01); *H05K 2203/1316* (2013.01)

(58) Field of Classification Search
CPC .................... H01L 21/4853; H01L 23/49838; H01L 23/49811; H05K 1/0222; H05K 1/0298; H05K 3/284; H05K 3/46

USPC ......... 438/117, 118, 119, 637, 639, 666, 667, 438/672
See application file for complete search history.

(56) References Cited

U.S. PATENT DOCUMENTS 6,476,476 B1  11/2002  Glenn
6,623,279 B2   9/2003  Derian et al.
(Continued)

FOREIGN PATENT DOCUMENTS

DE  102005002707 B4   7/2007
EP       2244291 A1  10/2010

OTHER PUBLICATIONS

International Search Report and Written Opinion—PCT/US2015/039678—ISA/EPO—Sep. 24, 2015.

*Primary Examiner* — Kevin M Picardat
(74) *Attorney, Agent, or Firm* — Loza & Loza, LLP

(57) ABSTRACT

Some novel features pertain to an integrated device that includes a substrate, a first interconnect coupled to the substrate, and a second interconnect surrounding the first interconnect. The second interconnect may be configured to provide an electrical connection to ground. In some implementations, the second interconnect includes a plate. In some implementations, the integrated device also includes a dielectric material between the first interconnect and the second interconnect. In some implementations, the integrated device also includes a mold surrounding the second interconnect. In some implementations, the first interconnect is configured to conduct a power signal in a first direction. In some implementations, the second interconnect is configured to conduct a grounding signal in a second direction. In some implementations, the second direction is different from the first direction. In some implementations, the integrated device may be a package-on-package (PoP) device.

29 Claims, 17 Drawing Sheets

(51) Int. Cl.
*H05K 3/28* (2006.01)
*H05K 3/46* (2006.01)

(56) References Cited

U.S. PATENT DOCUMENTS 7,557,445 B2    7/2009  Choi et al.
7,919,870 B2    4/2011  Trezza
7,952,196 B1    5/2011  Iannotti et al.
2010/0164062 A1*  7/2010  Wang ................ H01L 21/76898
                                                            257/532
2012/0313226 A1   12/2012  Koizumi et al.
2013/0105987 A1*  5/2013  Gallegos ............. H05K 1/0222
                                                            257/774

* cited by examiner

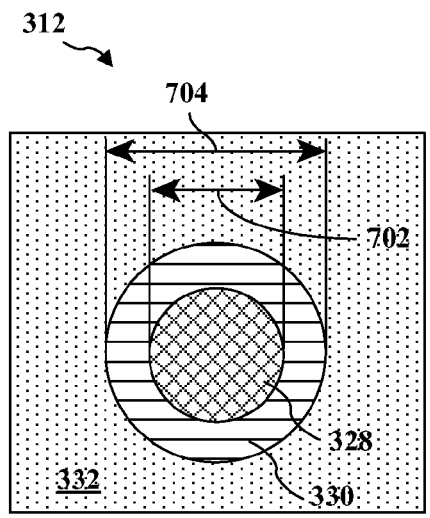
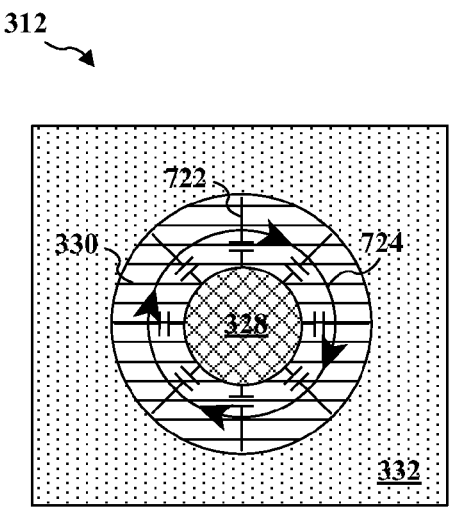
FIG. 7A  FIG. 7C
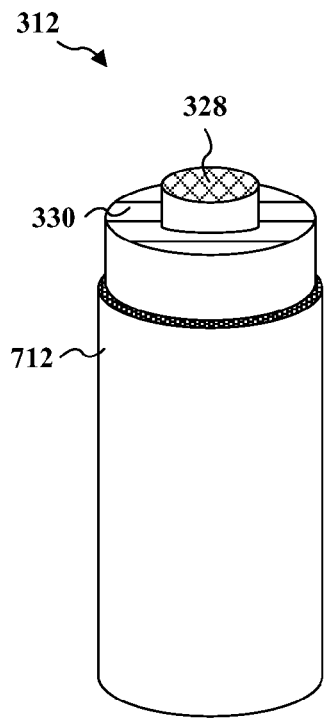
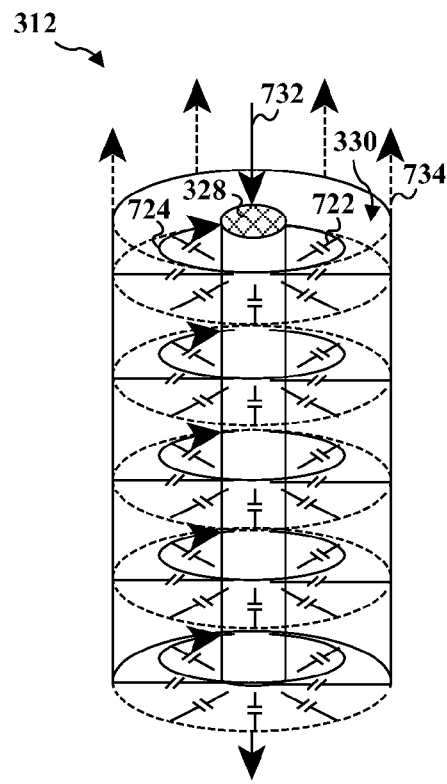
FIG. 7B  FIG. 7D

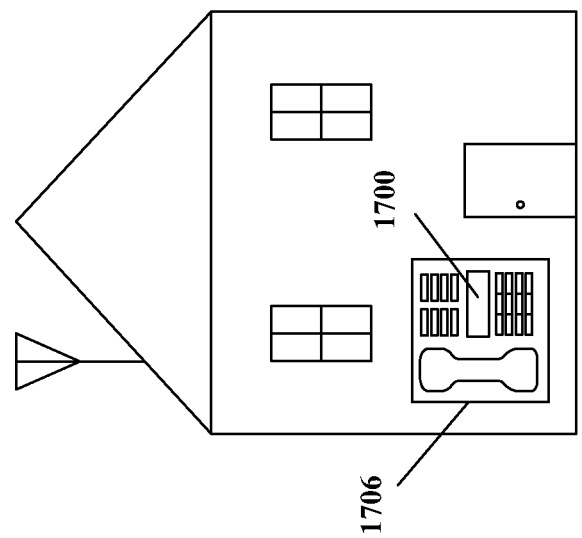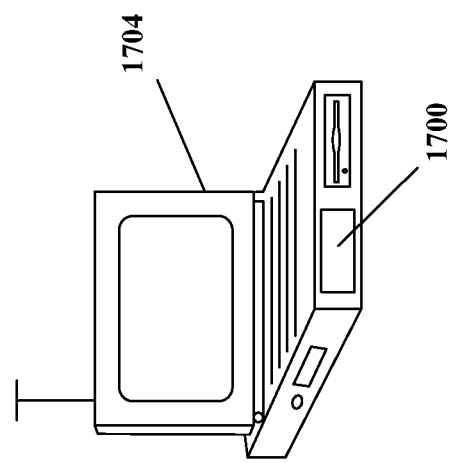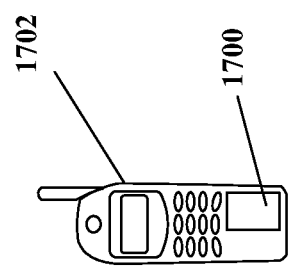
FIG. 17

INTEGRATED DEVICE COMPRISING COAXIAL INTERCONNECT

BACKGROUND

1. Field

Various features relate, generally, to an integrated device and, more specifically, to an integrated device including an interconnect surrounding another interconnect and providing a connection to ground.

2. Background

FIG. 1 illustrates a first cross-sectional view of a conventional integrated device 100 (e.g., a package-on-package (PoP) integrated device). The conventional integrated device 100 includes a first package 102 and a second package 104. The first package 102 may include a first substrate 106, a first die 108, a first set of solder balls 110, and a first set of interconnects 112. The first set of solder balls 110 may electrically connect the first substrate 106 with the first die 108. The first substrate 106 may include electrical interconnects 114 and dielectric layers 116. The electrical interconnects 114 may traverse horizontally and/or vertically throughout the first substrate 106 to electrically connect various components contacting the first substrate 106. For example, the electrical interconnects 114 may electrically connect one or more solder balls 110 with one or more interconnects 112. The electrical interconnects 114 may be (at least) partially surrounded by the dielectric layers 116.

The second package 104 may include a second substrate 118, a second die 120, and a second set of solder balls 122. The second set of solder balls 122 may electrically connect the second substrate 118 with the second die 120. The second substrate 118 may include electrical interconnects 124 and dielectric layers 128. A mold 124 may exist in any portion of the space between the first substrate 106 and the second substrate 118. For example, the mold 124 may encapsulate (at least) a portion of the first set of interconnects 112, the first set of solder balls 110, and/or the first die 108.

The first set of interconnects 112 may electrically connect the first substrate 106 with the second substrate 118. Each interconnect 112 may carry a power signal or a ground signal (e.g., a signal connected to ground).

FIG. 2 is a second cross-sectional view of the conventional integrated device 100. The second cross-sectional view illustrated in FIG. 2 is along line 126 in FIG. 1. As illustrated in FIG. 2, a number (e.g., eight) interconnects (e.g., interconnects $112_{1-8}$) may electrically connect the first substrate 106 with the second substrate 118. However, such designs have limitations. Any two interconnects carrying a power signal must be separated by at least one interconnect carrying a ground signal; otherwise, the power signals may interfere with each other, thereby causing unacceptable levels of insertion loss and/or isolation. Of the eight interconnects $112_{1-8}$ shown in FIG. 2, four alternating interconnects (e.g., interconnects $112_1$, $112_3$, $112_5$, $112_7$) may carry a power signal while the other four alternating interconnects (e.g., interconnects $112_2$, $112_4$, $112_6$, $112_8$) may carry a ground signal. Such designs do not allow for a power signal to be transmitted through every interconnect 112 (e.g., all of the interconnects $112_{1-8}$). For example, if more than four power signal connections are needed between the first substrate 106 and the second substrate 118, additional interconnects 112 must be added (beyond the eight interconnects $112_{1-8}$ already illustrated in FIG. 2). Additional interconnects would undesirably expand the size of the overall conventional integrated device 100. Therefore, existing designs may benefit from enhancements that allow power signals to be conducted through every interconnect while maintaining acceptable levels of isolation and/or insertion loss.

SUMMARY

The following presents a simplified summary of one or more examples and/or aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various features, apparatus and methods described herein provide an integrated device that includes a substrate, a first interconnect coupled to the substrate, and a second interconnect surrounding the first interconnect and configured to provide an electrical connection to ground.

A first example provides an integrated device that includes a substrate, a first interconnect coupled to the substrate, and a second interconnect surrounding the first interconnect and configured to provide an electrical connection to ground. According to some aspects, the second interconnect includes a plate. According to some aspects, the integrated device includes a dielectric material between the first interconnect and the second interconnect. According to some aspects, a mold surrounds the second interconnect. According to some aspects, the first interconnect is configured to conduct a power signal in a first direction. According to some aspects, the second interconnect is configured to conduct a grounding signal in a second direction. According to some aspects, the second direction is different from the first direction. According to some aspects, the integrated device includes one of at least an interposer, a package device, and/or a PoP device. In some aspects, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, a first interconnect coupled to the substrate, and a second interconnect surrounding the first interconnect and configured to provide an electrical connection to ground. According to some aspects, the second interconnect includes a plate. According to some aspects, the apparatus includes a dielectric material between the first interconnect and the second interconnect. According to some aspects, a mold surrounds the second interconnect. According to some aspects, the first interconnect is configured to conduct a power signal in a first direction. According to some aspects, the second interconnect is configured to conduct a grounding signal in a second direction. According to some aspects, the second direction is different from the first direction. According to some aspects, the apparatus includes one of at least an interposer, a package device, and/or a PoP device. In some aspects, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method that includes providing a first interconnect above a substrate, and providing a second interconnect above the substrate, wherein the second substrate surrounds the first substrate and is configured to provide an electrical connection to ground. According to some aspects, the second interconnect includes a plate. According to some aspects, the integrated device includes a dielectric material between the first interconnect and the second interconnect. According to some aspects, a mold surrounds the second interconnect. According to some aspects, the first interconnect is configured to conduct a power signal in a first direction. According to some aspects, the second interconnect is configured to conduct a grounding signal in a second direction. According to some aspects, the second direction is different from the first direction. According to some aspects, the integrated device includes one of at least an interposer, a package device, and/or a PoP device. In some aspects, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

These and other examples and/or aspects of the disclosure will become more fully understood upon a review of the detailed description, which follows. Other aspects, features, and embodiments of the present disclosure will become apparent to those of ordinary skill in the art, upon reviewing the following description of specific, exemplary embodiments of the present disclosure in conjunction with the accompanying figures.

DRAWINGS

Various features, nature and advantages may become apparent from the detailed description set forth below when taken in conjunction with the drawings in which like reference characters identify correspondingly throughout.

FIGS. 7A-7D illustrate various aspects of an exemplary coaxial connection.

FIG. 17 illustrates various electronic devices that may integrate an integrated device, a semiconductor device, a die, an integrated circuit and/or printed circuit board (PCB) described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., a package-on-package (PoP) integrated device) that includes a substrate, a first interconnect coupled to the substrate, and a second interconnect surrounding the first interconnect and configured to provide an electrical connection to ground. The second interconnect may include a plate. The integrated device may include a dielectric material between the first interconnect and the second interconnect. A mold may surround the second interconnect. The first interconnect may be configured to conduct a power signal in a first direction. The second interconnect may be configured to conduct a grounding signal in a second direction. The second direction may be different from the first direction. The integrated device may include one of at least an interposer, a package device, and/or a PoP device.

TERMS AND DEFINITIONS

An interconnect is an element or component that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

A netlist is defined as a set of interconnects, a set of active elements (e.g., transistor) and/or a set of passive elements (e.g., resistor, capacitor) that form and/or define the connectivity of a circuit in an integrated device.

First Exemplary Integrated Device

Figure 3:
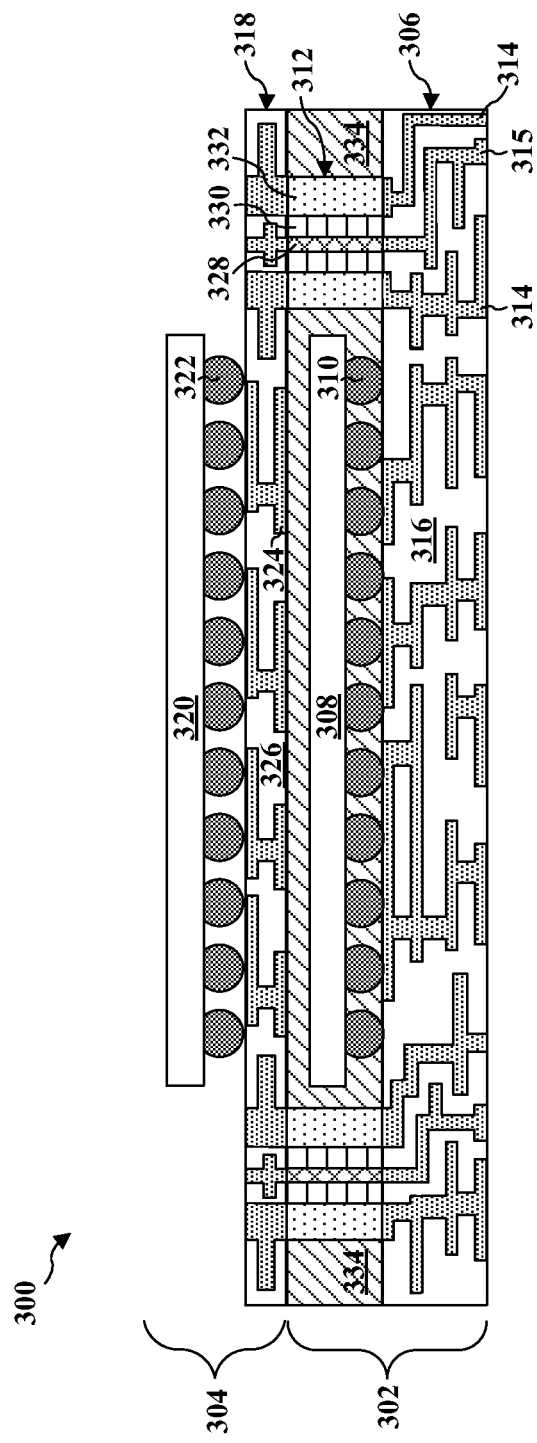
FIG. 3 illustrates a cross-sectional view of a first exemplary integrated device.

FIG. 3 illustrates an integrated device 300 (e.g., a PoP integrated device) that includes a first package 302 and a second package 304. The first package 302 may include a first substrate 306, a first die 308, a first set of solder balls 310, and at least one coaxial connection 312. The first set of solder balls 310 may electrically connect the first substrate 306 with the first die 308. The first substrate 306 may include various materials without deviating from the scope of the present disclosure. As non-limiting examples, the first substrate 306 may include silicon, glass, ceramic, a wafer, and/or various organic materials. The first substrate 306 may include electrical interconnects 314 and 315, and dielectric layers 316. The electrical interconnects 314 and/or 315 may include various materials without deviating from the scope of the present disclosure. As a non-limiting example, the electrical interconnects 314 and/or 315 may include copper. The interconnects 314 and/or 315 may include one or more traces, vias and/or pads. The electrical interconnects 314 and/or 315 may traverse horizontally and/or vertically throughout the first substrate 306 to electrically connect various components contacting the first substrate 306. For example, the electrical interconnects 314 and/or 315 may electrically connect one or more solder balls 310 and one or more coaxial connections 312. The electrical interconnects 314 and/or 315 may be (at least) partially surrounded by the dielectric layers 316. The dielectric layers 316 may include various materials without deviating from the scope of the present disclosure. As a non-limiting example, the dielectric layers 316 may include silicon nitride (SiN).

The second package 304 may include a second substrate 318, a second die 320, and a second set of solder balls 322. The second set of solder balls 322 may electrically connect the second substrate 318 with the second die 320. The second substrate 318 may include various materials without deviating from the scope of the present disclosure. As non-limiting examples, the second substrate 318 may include silicon, glass, ceramic, a wafer, and/or various organic materials. The second substrate 318 may include electrical interconnects 324 and dielectric layers 326. The electrical interconnects 324 may include various materials without deviating from the scope of the present disclosure. As a non-limiting example, the electrical interconnects 324 may include Al. The electrical interconnects 324 may traverse horizontally and/or vertically throughout the second substrate 318 to electrically connect various components contacting the second substrate 318. For example, the electrical interconnects 324 may electrically connect one or more solder balls 322 and one or more coaxial connections 312. The electrical interconnects 324 may be (at least) partially surrounded by the dielectric layers 326. The dielectric layers 326 may include various materials without deviating from the scope of the present disclosure. As a non-limiting example, the dielectric layers 326 may include SiN.

A mold 334 may exist in any portion of the space between the first substrate 306 and the second substrate 318. For example, the mold 334 may (at least) partially surround the coaxial connections 312, the first set of solder balls 310, and/or the first die 308.

The coaxial connection 312 (e.g., coaxial transmission line) may connect the first substrate 306 with the second substrate 318. The coaxial connection 312 may include a first interconnect 328 (e.g., a signal interconnect configured to transmit a power signal), an insulation material 330, and a second interconnect 332 (e.g., a interconnect providing an electrical connection to ground). The insulation material 330 may include various materials without deviating from the scope of the present disclosure. As a non-limiting example, the insulation material 330 may include SiN. In some implementations, the insulation material 330 is a dielectric layer. In some implementations, the insulation material 330 may be an encapsulation layer (e.g., mold, epoxy). In some implementations, the insulation material 330 may be the same material as the mold 334.

The insulation material 330 may surround (at least) a portion of the first interconnect 328. The insulation material 330 may electrically insulate the first interconnect 328 from the second interconnect 332, thereby preventing signals in the first interconnect 328 from shorting through the second interconnect 332.

The first interconnect 328 may electrically connect the first substrate 306 with the second substrate 318. For example, the first interconnect 328 may electrically connect the electrical interconnects 314 of the first substrate 306 with the electrical interconnects 324 of the second substrate 318. The first interconnect 328 may also be electrically coupled to the interconnect 315. The first interconnect 328 may be configured to conduct a power signal in a first direction, such as from the first substrate 306 to the second substrate 318.

The second interconnect 332 may be a plate. The plate may include metal (e.g., Al). The second interconnect 332 may be configured to provide an electrical connection to ground. The second interconnect 332 may surround (at least) a portion of the insulation material 330. As such, the second interconnect 332 may surround (at least) a portion of the first interconnect 328. The second interconnect 332 may be configured to provide an electrical path for a grounding signal (e.g., a signal destined to ground) in a second direction. The second direction may be different from the first direction (described supra). For example, the grounding signal may be conducted from the second substrate 318 to the first substrate 306. The grounding signal may be conducted in other directions that will be readily apparent to one of ordinary skill in the art. The second interconnect 332 may be electrically coupled to the interconnect 314.

In some implementations, the interconnect 314 and/or the second interconnect 332 are part of a first netlist for a power distribution network (PDN) of the integrated device. For example, the interconnect 314 and/or the second interconnect 332 may be part of a ground netlist for a PDN of the integrated device.

In some implementations, the interconnect 315 and/or the first interconnect 328 are part of a second netlist for a power distribution network (PDN) of the integrated device. For example, the interconnect 315 and/or the first interconnect 328 may be part of a power netlist or a data signal netlist for a PDN of the integrated device.

Figure 4:
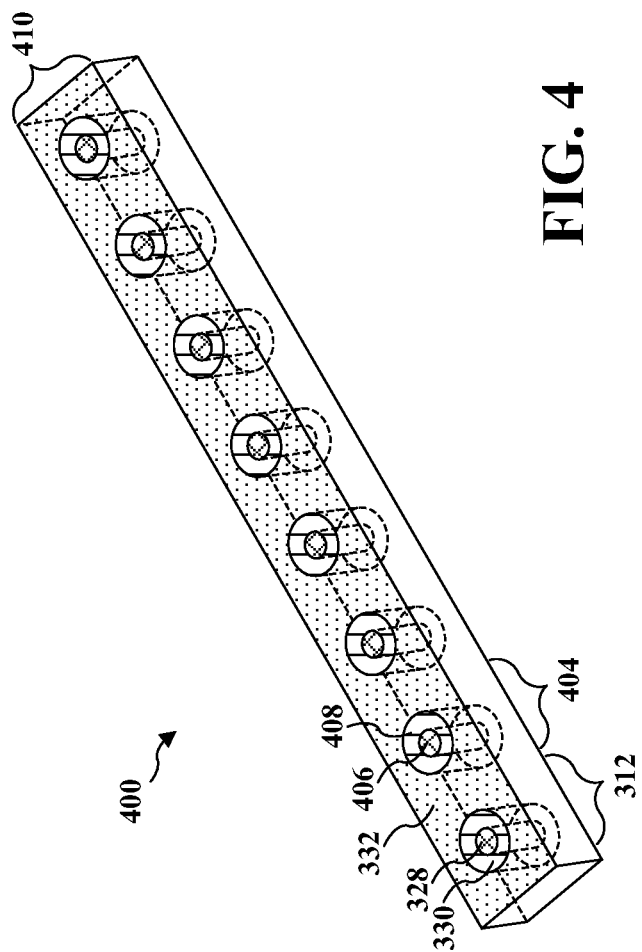
FIG. 4 illustrates a side perspective view of exemplary coaxial connections in the first exemplary integrated device.

Although the cross-sectional view illustrated in FIG. 3 shows two coaxial connections 312 (e.g., a left-hand-side coaxial connection 312 and a right-hand-side coaxial connection 312), the integrated device 300 may also include additional coaxial connections (e.g., one or more coaxial connections behind and/or in-front-of the right-hand-side coaxial connection 312 and/or the left-hand-side coaxial connection 312), as illustrated in FIG. 4.

FIG. 4 illustrates an angled perspective view of exemplary coaxial connections 400 in the first exemplary integrated device 300. In some implementations, the coaxial connections 400 is an interconnect means (e.g., coaxial interconnect means). The exemplary coaxial connections 400 may include a number (e.g., eight) of individual coaxial connections (e.g., coaxial connections 312, 404) in a row (e.g., row 410). However, one of ordinary skill in the art will understand that the row 410 may include as few as one coaxial connection (e.g., only coaxial connection 312) or as many as hundreds, thousands, or millions of coaxial connections (or more) without deviating from the scope of the present disclosure. As described in greater detail supra, each coaxial connection 312, 404 may include a first interconnect 328, 406 (e.g., a signal interconnect), an insulation material 330, 408, and a second interconnect 332 (e.g., a grounding interconnect). The second interconnect 332 may be a metal plate that is shared among one or more coaxial connections (e.g., coaxial connections 312, 404 share the same second interconnect 332). The second interconnect 332 surrounds the first interconnect 328 of coaxial connection 312 as well as the first interconnect 406 of coaxial connection 404. As described in greater detail supra, the second interconnect 332 may be configured to provide an electrical connection or path to ground.

Figure 1:
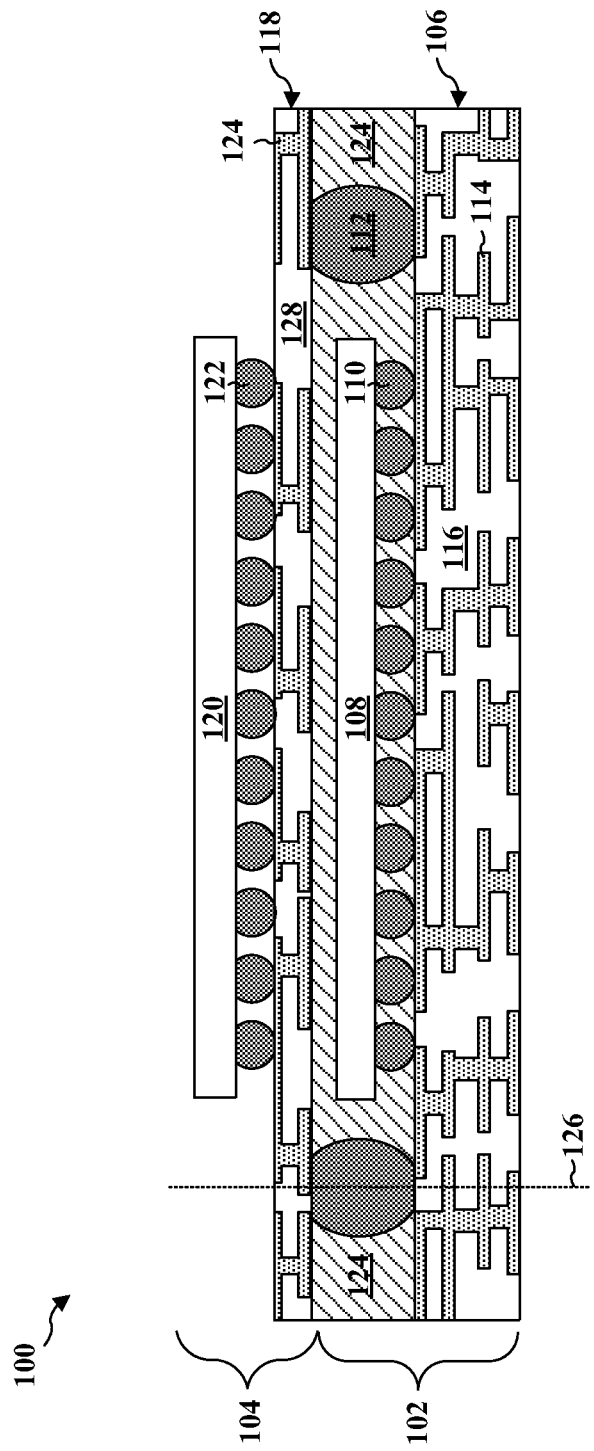
FIG. 1 illustrates a first cross-sectional view of a conventional integrated device.
Figure 2:
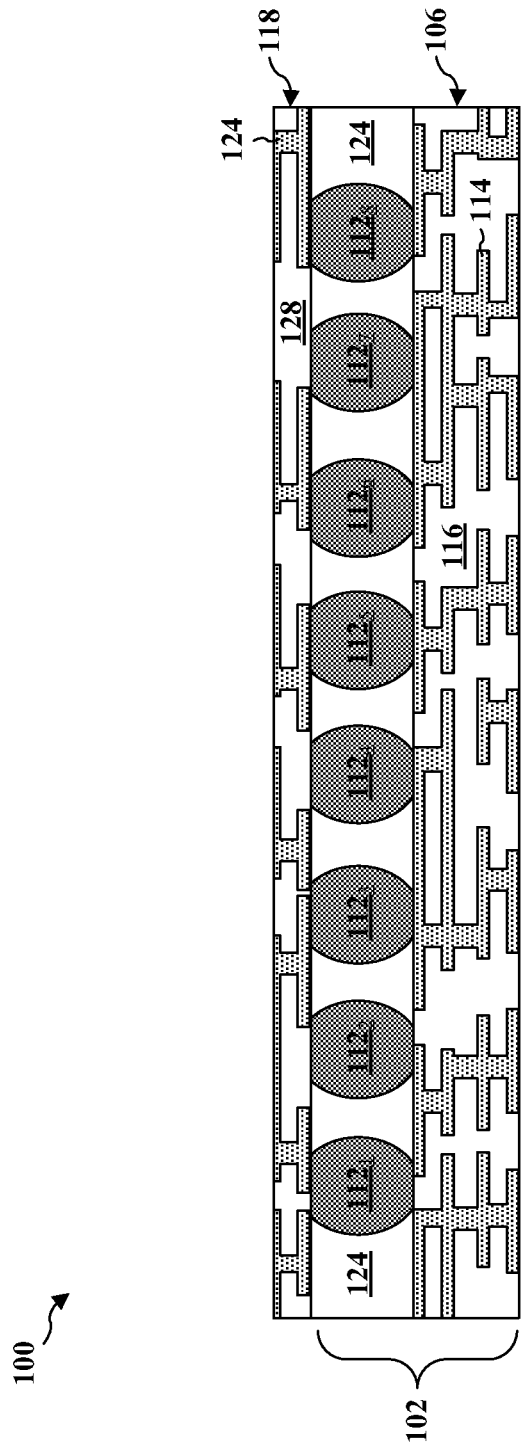
FIG. 2 illustrates a second cross-sectional view of the conventional integrated device.

Each coaxial connection (e.g., coaxial connection 312, 404) may conduct both a power signal as well as a grounding signal (e.g., a signal destined to ground). As described supra with reference to FIGS. 1-2, existing integrated devices (e.g., conventional integrated device 100) include connections (e.g., interconnects 112, 112$_{1-8}$) between substrates (e.g., substrates 106, 118) that can transmit only a power signal or a grounding signal. As such, existing integrated devices may require at least two connections (e.g., interconnect 112$_1$ and interconnect 112$_2$) to transmit both a power signal as well as a grounding signal. However, the present disclosure provides various examples and aspects of a coaxial connection (e.g., coaxial connection 312) that can transmit both a power signal as well as a grounding signal.

In some implementations, the first interconnect 328 and the interconnect 406 may be part of the same netlist or different netlist a power distribution network (PDN) of the integrated device.

In some implementations, at least one or more of the first interconnects (e.g., interconnects 328, 406) surrounded by the insulation material are inner interconnects of a coaxial interconnect/an interconnect means (e.g., coaxial interconnect means). In some implementations, the second interconnect 332 is an outer interconnect of a coaxial interconnect/an interconnect means (e.g., coaxial interconnect means). In some implementations, the one or more inner interconnects provide a first electrical path for a power signal, and the outer interconnect provide a second electrical path for a ground signal. In some implementations, the combination of at least one or more of the first interconnects (e.g., interconnects 328, 406), the insulation material, and/or the second interconnect 332 is configured to operate as a coaxial interconnect/an interconnect means (e.g., coaxial interconnect means).

Second Exemplary Integrated Device

Figure 5:
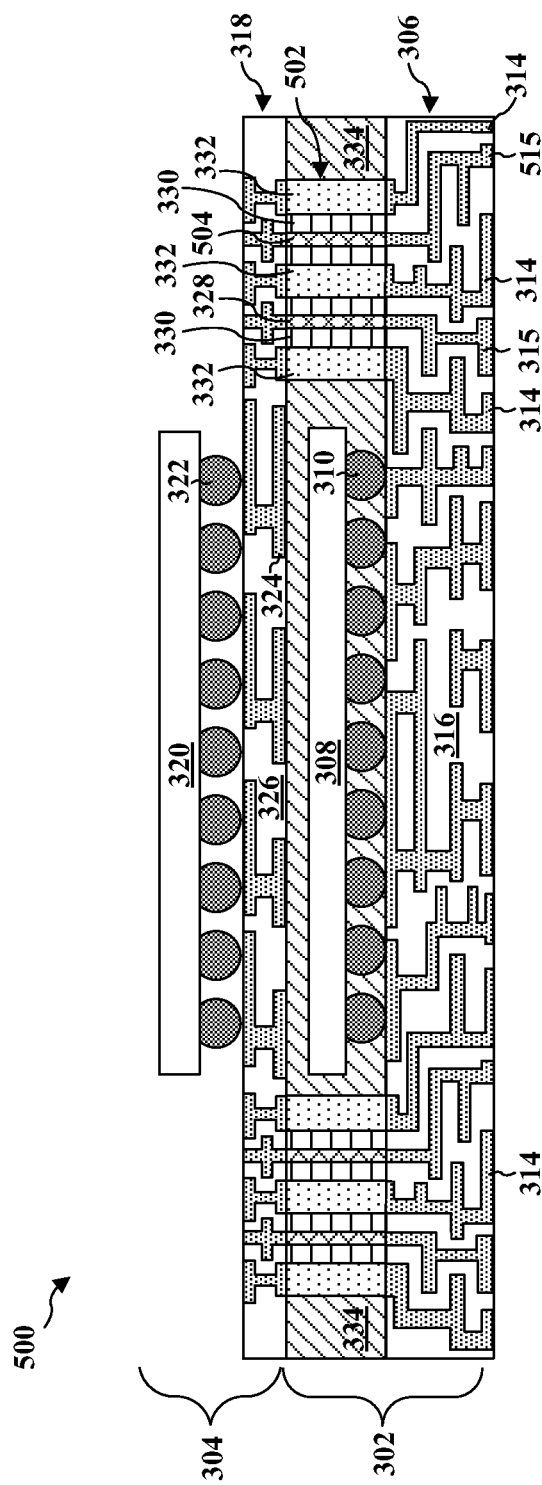
FIG. 5 illustrates a cross-sectional view of a second exemplary integrated device.

FIG. 5 illustrates a cross-sectional view of a second exemplary integrated device 500. The second exemplary integrated device 500 may include a coaxial connection 502. The coaxial connection 502 may connect the first substrate 306 with the second substrate 318. The substrate 306 may include interconnects 314, 315 and 515. The interconnects 314, 315 and/or 515 may include one or more traces, vias and/or pads. The coaxial connection 502 may include two (or more) first interconnects 328, 504 (e.g., signal interconnects configured to transmit a power signal), an insulation material 330, and a second interconnect 332 (e.g., a interconnect providing an electrical connection to ground). The first interconnects 328, 504 may electrically connect the first substrate 306 with the second substrate 318. For example, the first interconnects 328, 504 may respectively electrically connect the electrical interconnects 315 and 515 of the first substrate 306 with the electrical interconnects 324 of the second substrate 318. The first interconnects 328, 504 may be configured to conduct power signals in a first direction, such as from the first substrate 306 to the second substrate 318.

The insulation material 330 may surround (at least) a portion of the first interconnects 328, 504. The insulation material 330 may electrically insulate the first interconnects 328, 504 from the second interconnect 332, thereby preventing signals in the first interconnects 328, 504 from shorting through the second interconnect 332. The insulation material 330 surrounding each first interconnects 328, 504 may vary based on various design parameters. For example, the power and/or amperage of the signal in the first interconnects 328, 504 may affect the type and/or amount of the insulation material 330 surrounding that the first interconnects 328, 504.

The second interconnect 332 may be configured to provide an electrical connection to ground. The second interconnect 332 may be a plate. The plate may include metal (e.g., Al). The second interconnect 332 may surround (at least) a portion of the insulation material 330. As such, the second interconnect 332 may surround (at least) a portion of the first interconnects 328, 504. The second interconnect 332 may be configured to conduct a grounding signal (e.g., a signal destined to ground) in a second direction. The second direction may be different from the first direction (described supra). For example, the grounding signal may be conducted from the second substrate 318 to the first substrate 306. The grounding signal may be conducted in other directions that will be readily apparent to one of ordinary skill in the art. The second interconnect 332 may be electrically coupled to the first interconnect 314.

The mold 334 may exist in any portion of the space between the first substrate 306 and the second substrate 318. For example, mold 334 may surround the coaxial connection 502, the first set of solder balls 310, and/or the first die 308.

Each coaxial connection 502 may conduct two (or more) power signals (e.g., a power signal in the first interconnect 328 and another power signal in the first interconnect 504) as well as a grounding signal (e.g., a signal in the second interconnect 332 and destined to ground). As described supra with reference to FIGS. 1-2, existing integrated devices (e.g., conventional integrated device 100 in FIGS. 1-2) include connections (e.g., interconnects 112, 112$_{1-8}$ in FIGS. 1-2) between substrates (e.g., substrates 106, 118 in FIGS. 1-2) that transmit only a power signal or a grounding signal. As such, existing integrated devices may require at least two connections (e.g., interconnect 112$_1$ and interconnect 112$_2$ in FIG. 2) to transmit both a power signal as well as a grounding signal. However, the present disclosure provides various examples of a coaxial connection (e.g., coaxial connection 502 in FIG. 5) that transmits two (or more) power signals as well as a grounding signal.

In some implementations, the interconnect 314 and/or the second interconnect 332 are part of a first netlist for a power distribution network (PDN) of the integrated device. For example, the interconnect 314 and/or the second interconnect 332 may be part of a ground netlist for a PDN of the integrated device.

In some implementations, the interconnect 315 and/or the first interconnect 328 are part of a second netlist for a power distribution network (PDN) of the integrated device. For example, the interconnect 315 and/or the first interconnect 328 may be part of a power netlist or a data signal netlist for a PDN of the integrated device.

In some implementations, the interconnect 515 and/or the interconnect 504 are part of a third netlist for a power distribution network (PDN) of the integrated device. For example, the interconnect 515 and/or the interconnect 504 may be part of a power netlist or a data signal netlist for a PDN of the integrated device.

In some implementations, the second netlist and the third netlist are part of the same netlist, while in some instances, the second netlist and the third netlist are different netlists.

Figure 6:
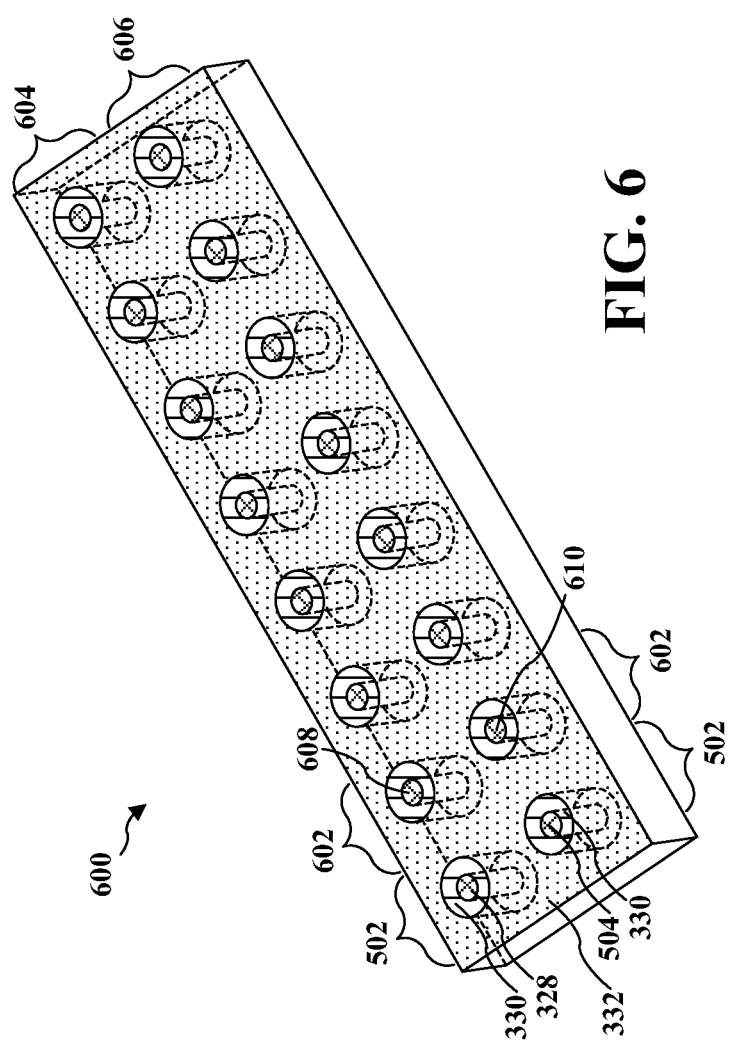
FIG. 6 illustrates a side perspective view of exemplary coaxial connections in the second exemplary integrated device.

Although the cross-sectional view illustrated in FIG. 5 shows two coaxial connections 502 (e.g., a left-hand-side coaxial connection 502 and a right-hand-side coaxial connection 502), the integrated device 500 may also include additional coaxial connections (e.g., one or more coaxial connections behind and/or in-front-of the right-hand-side coaxial connection 502 and/or the left-hand-side coaxial connection 502), as illustrated in FIG. 6.

FIG. 6 illustrates a side perspective view of exemplary coaxial connections 600 in the second exemplary integrated device 500. The exemplary coaxial connections 600 may include a number (e.g., eight) of individual coaxial connections (e.g., coaxial connections 502, 602) in rows (e.g., row 604 and row 606). However, one of ordinary skill in the art will understand that each row (e.g., row 604 and/or row 606) may include as few as one coaxial connection or as many as hundreds of coaxial connections (or more) without deviating from the scope of the present disclosure. As described in greater detail supra, each coaxial connection (e.g., coaxial connection 502) may include two (or more) first interconnects 328, 504 (e.g., a signal interconnect), an insulation material 330, and a second interconnect 332 (e.g., a grounding interconnect). The second interconnect 332 may be a metal plate that is shared among one or more coaxial connections (e.g., coaxial connections 502, 602 share the same second interconnect 332). The second interconnect 332 may surround the first interconnects 328, 504 of coaxial connection 502 as well as the first interconnects 608, 610 of coaxial connection 602. As described in greater detail supra, the second interconnect 332 may be configured to provide an electrical connection to ground.

In some implementations, at least one or more of the first interconnects (e.g., interconnects 328, 406, 608, 610) surrounded by the insulation material are inner interconnects of a coaxial interconnect/an interconnect means (e.g., coaxial interconnect means). In some implementations, the second interconnect 332 is an outer interconnect of a coaxial interconnect/an interconnect means (e.g., coaxial interconnect means). In some implementations, the one or more inner interconnects provide a first electrical path for a power signal, and the outer interconnect provide a second electrical path for a ground signal. In some implementations, the combination of at least one or more of the first interconnects (e.g., interconnects 328, 406), the insulation material, and/or the second interconnect 332 is configured to operate as a coaxial interconnect/an interconnect means (e.g., coaxial interconnect means).

Exemplary Aspects of a Coaxial Connection/Interconnects

Generally, FIGS. 7A-7D illustrate various aspects of a coaxial connection (e.g., coaxial connection 312). Specifically, FIG. 7A shows a top cross-sectional view of the exemplary coaxial connection 312. The first interconnect 328 may have a diameter 702. For example, to meet a characteristic impedance value of approximately 50 ohms, the diameter 702 may have exemplary values of about 10 µm-100 µm. The first interconnect 328 and the insulation material 330, collectively, may have a diameter 704. An exemplary range of values for the diameter 704 is about 40µ-400 µm. The insulation material 330 may have a thickness equal to the difference between the diameter 704 and the diameter 702. An exemplary range of values for the thickness of the insulation material 330 (e.g., the difference between diameter 704 and the diameter 702) is about 30 µm-300 µm (depending upon the dielectric constant of the insulation material 330).

FIG. 7B shows a side perspective view of the exemplary coaxial connection 312. As described in greater detail supra, the first exemplary coaxial connection 312 may include the first interconnect 328 and the insulation material 330. In some configurations, the first exemplary coaxial connection 312 may also include a shield 712 that surrounds (at least) a portion of the insulation material 330. The shield 712 may provide structural and/or mechanical support to the first interconnect 328 and/or the insulation material 330. For example, the shield 712 may hold the insulation material 330 around the first interconnect 328.

FIG. 7C shows a top view of various electrical aspects of the exemplary coaxial connection 312. As described in greater detail supra, the insulation material 330 may be located between two interconnects (e.g., the first interconnect 328 and the second interconnect 332). Accordingly, the dielectric material 330 may have a capacitance 722. Generally, capacitance is directly proportional to the surface area of the interconnect plates (e.g., the circumference of the first interconnect 328 and the circumference of the second interconnect 332) and inversely proportional to the separation distance between the plates (e.g., the thickness of the dielectric material 330, as described in greater detail supra). Also, the capacitance may be a function of the permittivity of the dielectric (e.g., the dielectric material 330).

Because dielectric material 330 is located between two interconnects (e.g., the first interconnect 328 and the second interconnect 332), a magnetic field 724 may exist between the two interconnects (e.g., between the first interconnect 328 and the second interconnect 332). For example, if the current in the first interconnect 328 is traveling downwards (e.g., into the page), then the magnetic field 724 will be in a clockwise direction, as illustrated in FIG. 7C. The value of the magnetic field 724 may be determined using various methods known to one of ordinary skill in the art, such as Ampere's Law.

FIG. 7D shows a side view of various electrical aspects of the exemplary coaxial connection 312. The first interconnect 328 may be configured to conduct an electrical signal (e.g., a power signal) in a first direction 732 (e.g., from top to bottom). The second interconnect 332 (see FIGS. 7A, 7C) may be configured to conduct an electrical signal (e.g., a grounding signal, such as a signal destined to ground) in a second direction 734 (e.g., from bottom to top). As illustrated in FIG. 7D, the second direction 734 may be different from the first direction 732. As described in greater detail supra, the dielectric material 330 may have a capacitance 722, and a magnetic field 724 may exist between the first interconnect 328 and the second interconnect 332 (see FIGS. 7A, 7C).

Figure 8:
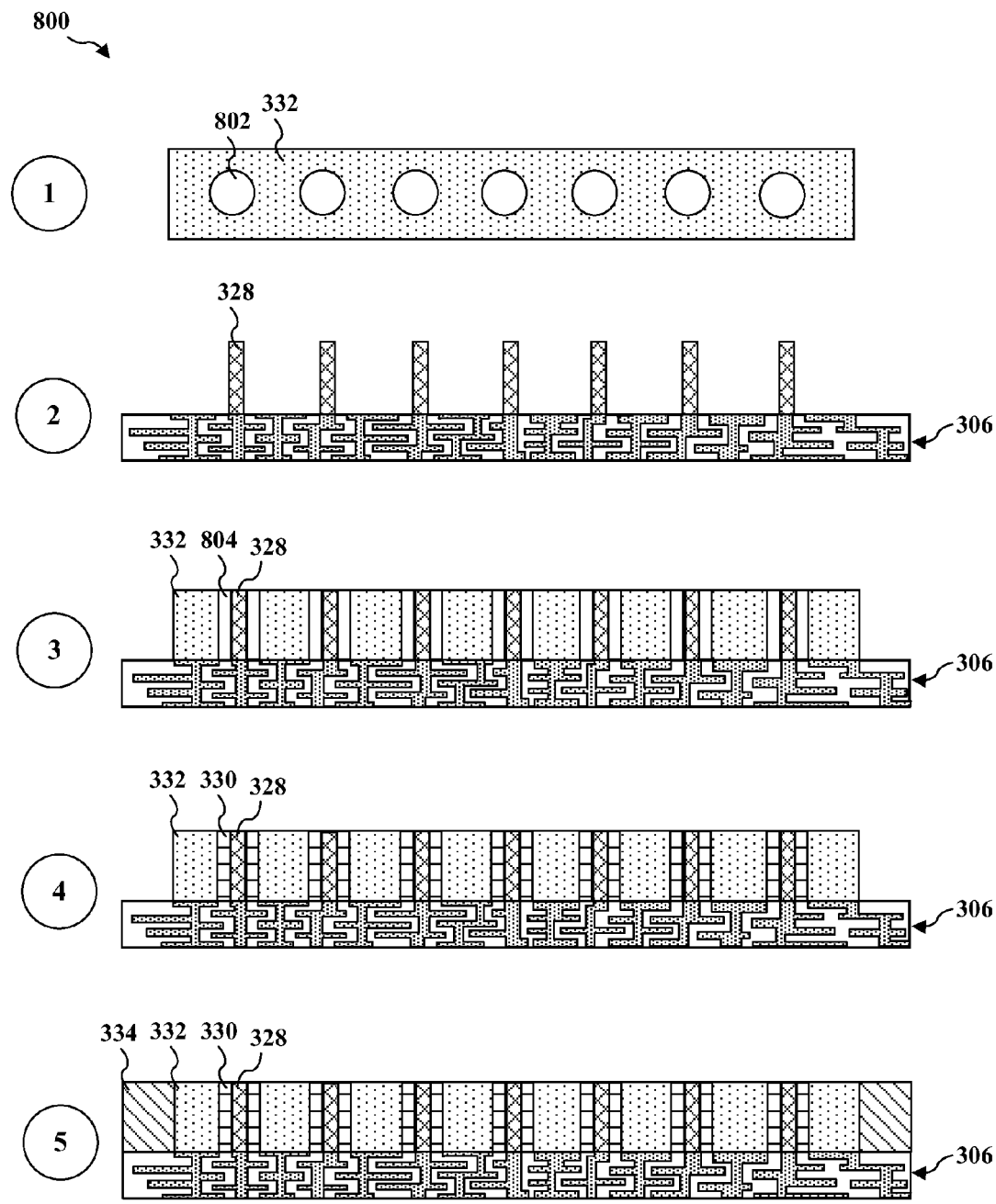
FIG. 8 illustrates a first exemplary sequence for providing/fabricating the exemplary coaxial connections in the first exemplary integrated device.

Exemplary Sequence for Providing/Fabricating Exemplary Coaxial Connections in the First Exemplary Integrated Device FIG. 8 illustrates a first exemplary sequence 800 for providing/fabricating the exemplary coaxial connections 400 in the first exemplary integrated device 300. The sequence 800 may include various stages. One of ordinary skill in the art will understand that the order of some of the stages illustrated in FIG. 8 may be changed without deviating from the scope of the present disclosure. In some implementations, several stages may be combined into a single stage. Detailed descriptions of various elements mentioned infra are provided supra and therefore will not be repeated.

Stage 1 of FIG. 8, illustrates a state after an interconnect (e.g., the second interconnect 332) is provided. The second interconnect 332 may include one or more holes 802.

Stage 2 illustrates a state after another interconnect (e.g., the first interconnect 328) is provided above (e.g., on top of) a substrate (e.g., the substrate 306) using a plating process. The plating process may include providing multiple layers of an electrically-conductive material on top of one another to produce a column or pillar-like shape extending upwards from the substrate 306. Although this example refers to a plating process, one of ordinary skill in the art will understand that various techniques may be used to provide the first interconnect 328 above the substrate 306 without deviating from the scope of the present disclosure. In some implementations, a substrate is provided (e.g., formed) and a plating process is performed to form the interconnect 328. The substrate that is provided may include one or more interconnects (e.g., traces, vias, pads).

Stage 3 illustrates a state after the second interconnect 332 is provided above (e.g., on top of) the substrate 306 such that the first interconnects 328 are placed through/inside the holes 802 of the second interconnect 332. Afterwards, at least some space 804 may exist between the first interconnect 328 and the second interconnect 332.

Stage 4 illustrates a state after a dielectric material 330 is provided in the space 804 between the first interconnect 328 and the second interconnect 332.

Stage 5 illustrates a state after a mold 334 (e.g., an encapsulation mold) is provided. The mold 334 may surround (at least) a portion of the second interconnect 332. The mold 334 may provide structural/mechanical support to the first interconnect 328, the insulation material 330, and/or the second interconnect 332. In some implementations, stage 4 may be optional and the mold 334 may be provided in the space 804.

Figure 9:
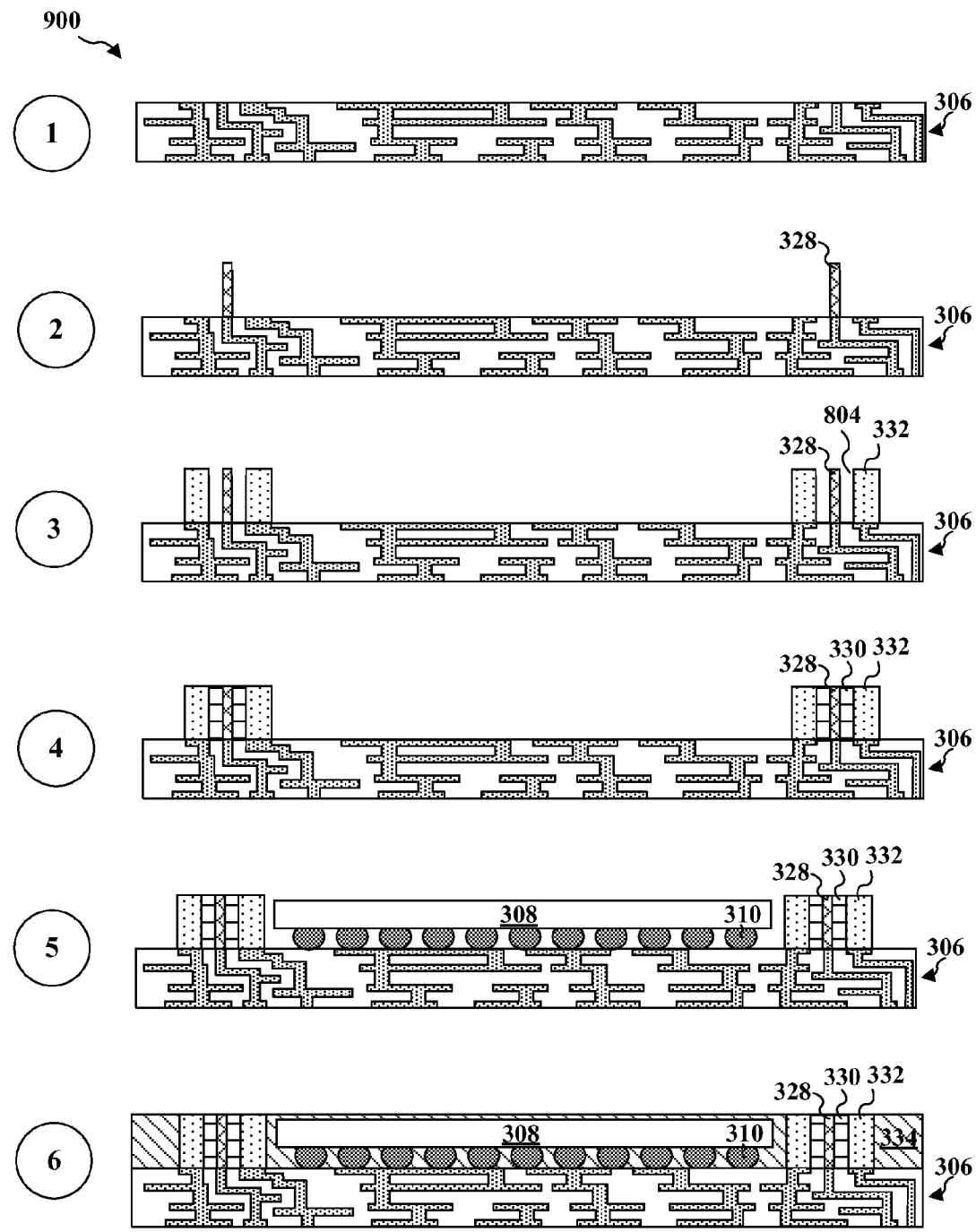
FIG. 9 illustrates an exemplary sequence for providing/fabricating the first exemplary integrated device.

Exemplary Sequence for Providing/Fabricating First and Second Exemplary Integrated Devices FIG. 9 illustrates an exemplary sequence 900 for providing/fabricating the first exemplary integrated device 300. The sequence 900 may include various stages. One of ordinary skill in the art will understand that the order of some of the stages illustrated in FIG. 9 may be changed without deviating from the scope of the present disclosure. Moreover, in some implementations, several stages may be represented into a single stage. Detailed descriptions of various elements mentioned infra are provided supra and therefore will not be repeated.

Stage 1 of FIG. 9 illustrates a state after a substrate (e.g., substrate 306) is provided. The substrate includes dielectric layers and interconnects (e.g., traces, vias, pads).

Stage 2 illustrates a state after an interconnect (e.g., the first interconnect 328) is provided above (e.g., on top of) the substrate 306 using a plating process, as described in greater detail supra. One of ordinary skill in the art will understand that various techniques may be used to provide the first interconnect 328 above the substrate 306 without deviating from the scope of the present disclosure.

Stage 3 illustrates a state after another interconnect (e.g., the second interconnect 332) may be provided above (e.g., on top of) the substrate 306. In some configurations, the second interconnect 332 is a metal plate with holes. At least some space 804 may exist between the first interconnect 328 and the second interconnect 332.

Stage 4 illustrates a state after a dielectric material 330 is provided in the space 804 between the first interconnect 328 and the second interconnect 332.

Stage 5 illustrates a state after a die 308 is provided (e., coupled) to the substrate. As shown in stage 5, the die 308 is coupled to a set of solder balls 310. The set of solder balls 310 are coupled to the interconnects of the substrate 306. The die 308 may form an electrical connection with the set of solder balls 310 and interconnects of the substrate 306. In some implementations, the die 308 may be provided and coupled to the substrate before the interconnects 328 and/or 332 are provided (e.g., formed) on the substrate.

Stage 6 illustrates a state after a mold 334 (e.g., an encapsulation mold) is provided. The mold 334 may surround (at least) a portion of the first interconnect 328, the second interconnect 332, the dielectric material 330, the set of solder balls 310, and/or the die 308. The mold 334 may provide structural and/or mechanical support to the first interconnect 328, the second interconnect 332, the dielectric material 330, the set of solder balls 310, and/or the die 308.

Figure 10:
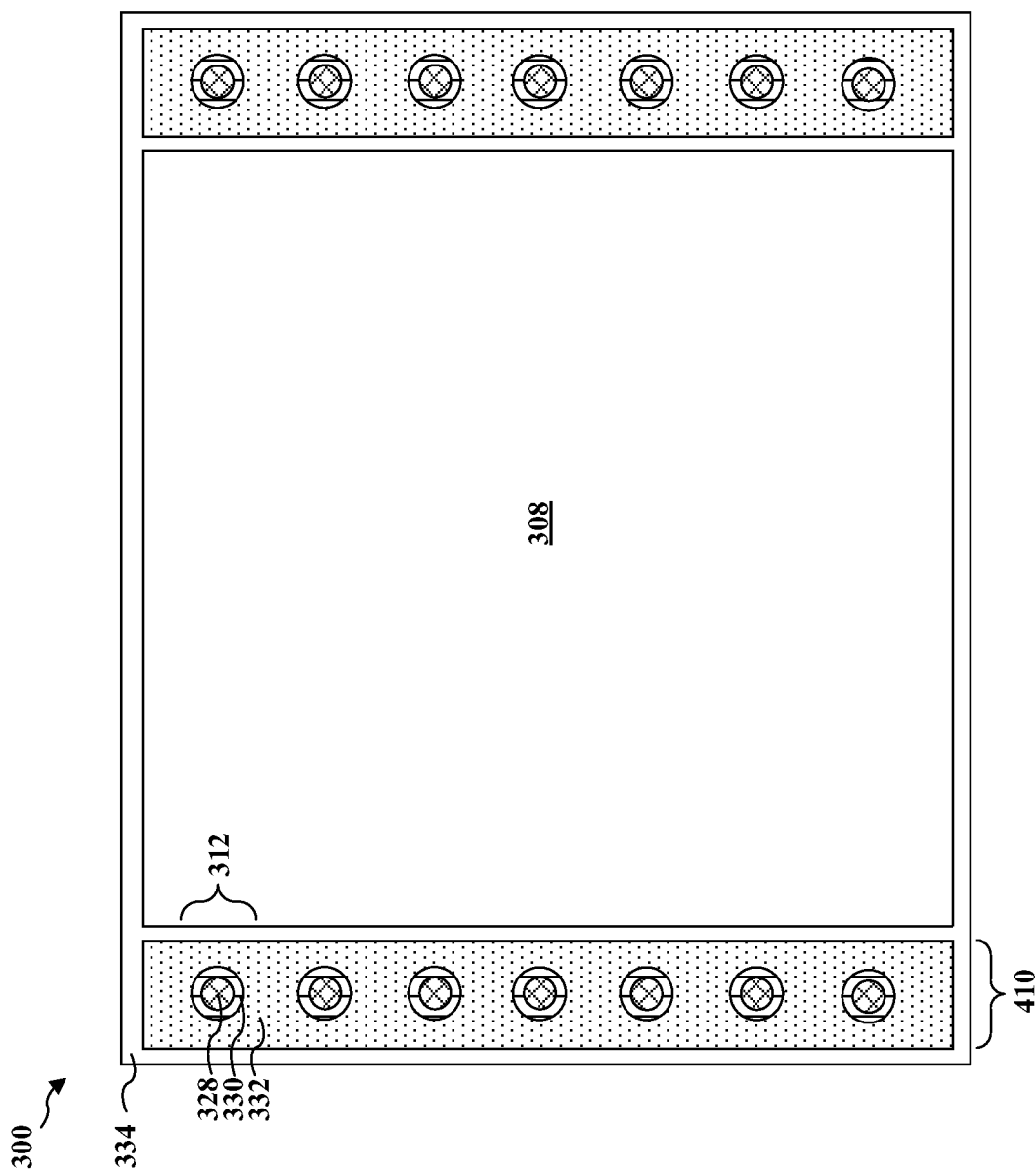
FIG. 10 illustrates a top cross-sectional view of the first exemplary integrated device.

FIG. 10 illustrates a top cross-sectional view of the first exemplary integrated device 300. The integrated device 300 may include one or more coaxial connections 312 in a row 410 on one or more sides of the die 308. Each coaxial connection 312 may include a first interconnect 328, a second interconnect 332 surrounding the first interconnect 328, and an insulation material 330 between the first interconnect 328 and the second interconnect 332. The row 410 of coaxial connection(s) 312 may be surrounded by the mold 334. Detailed descriptions of various elements mentioned supra have already been provided herein and therefore will not be repeated.

Figure 11:
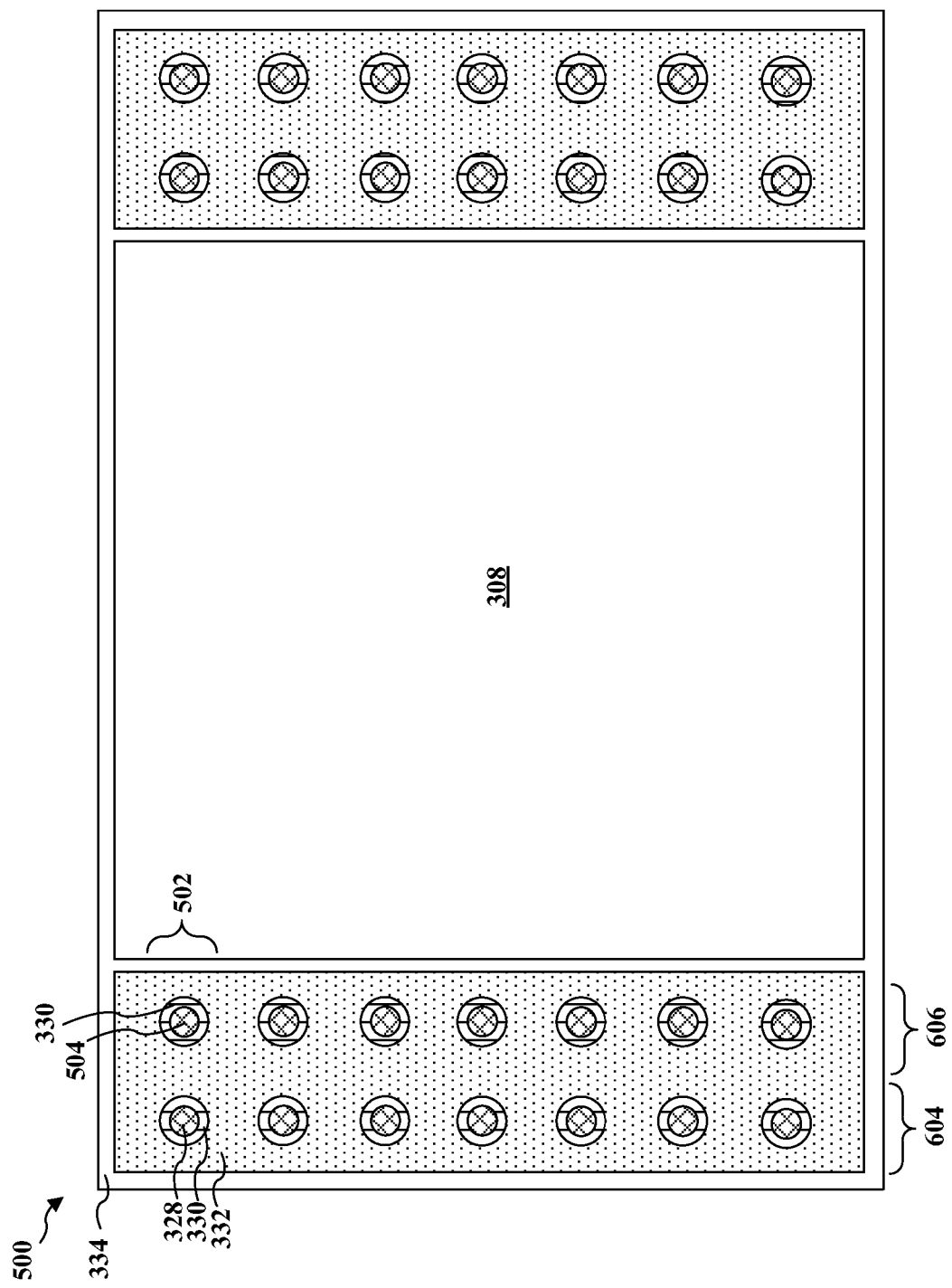
FIG. 11 illustrates a top cross-sectional view of the second exemplary integrated device.

FIG. 11 illustrates a top perspective view of the second exemplary integrated device 500. The integrated device 500 may include one or more sets of coaxial connections 502 in rows 604, 606 on one or more sides of the die 308. Each coaxial connection 502 may include first interconnects 328, 504, a second interconnect 332 surrounding the first interconnects 328, 504, and an insulation material 330 between the first interconnects 328, 504 and the second interconnect 332. The rows 604, 606 of coaxial connection(s) 502 may be surrounded by the mold 334. Detailed descriptions of various elements mentioned supra have already been provided herein and therefore will not be repeated.

Figure 12:
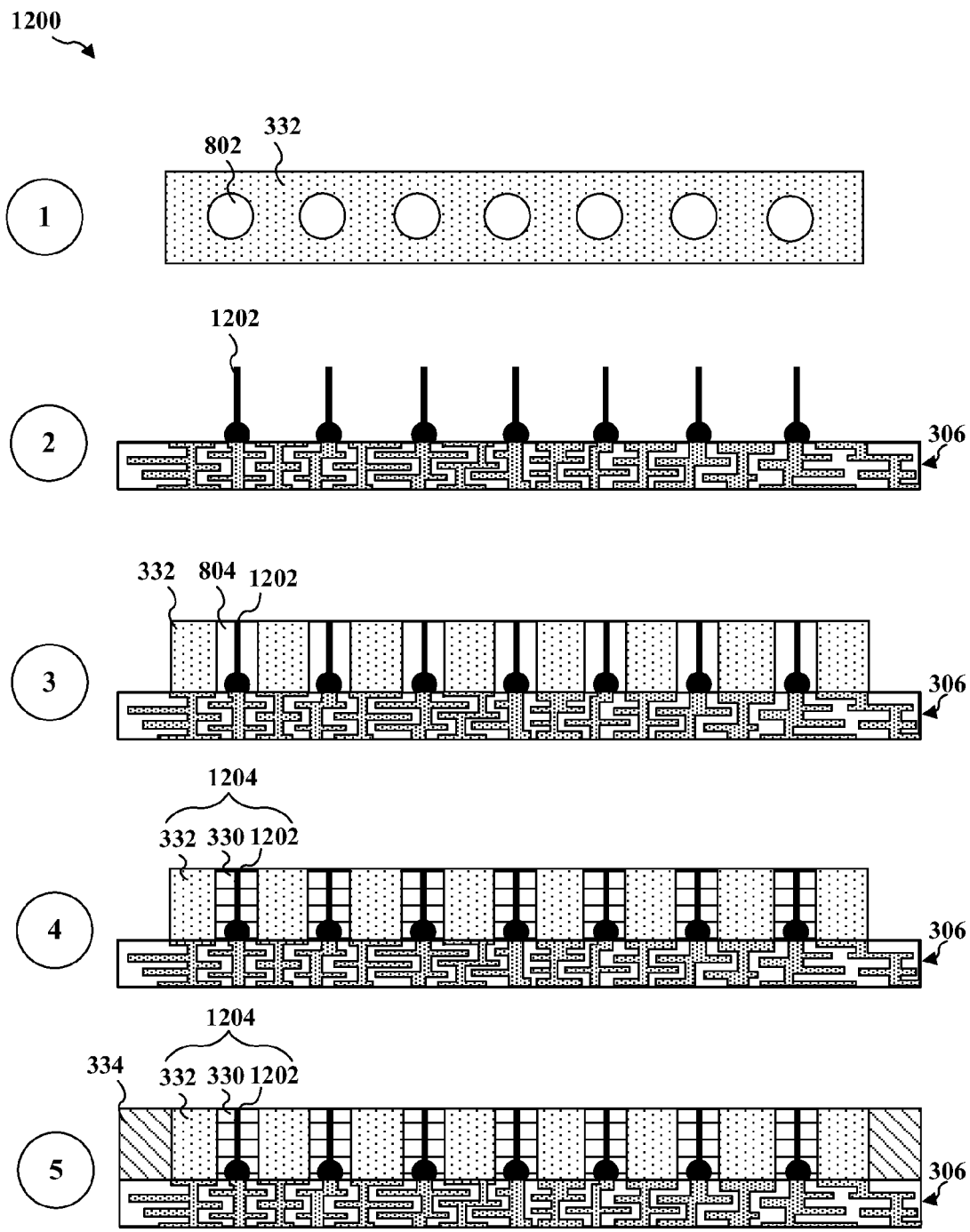
FIG. 12 illustrates an exemplary sequence for providing/fabricating exemplary coaxial connections in a third exemplary integrated device.
Figure 14:
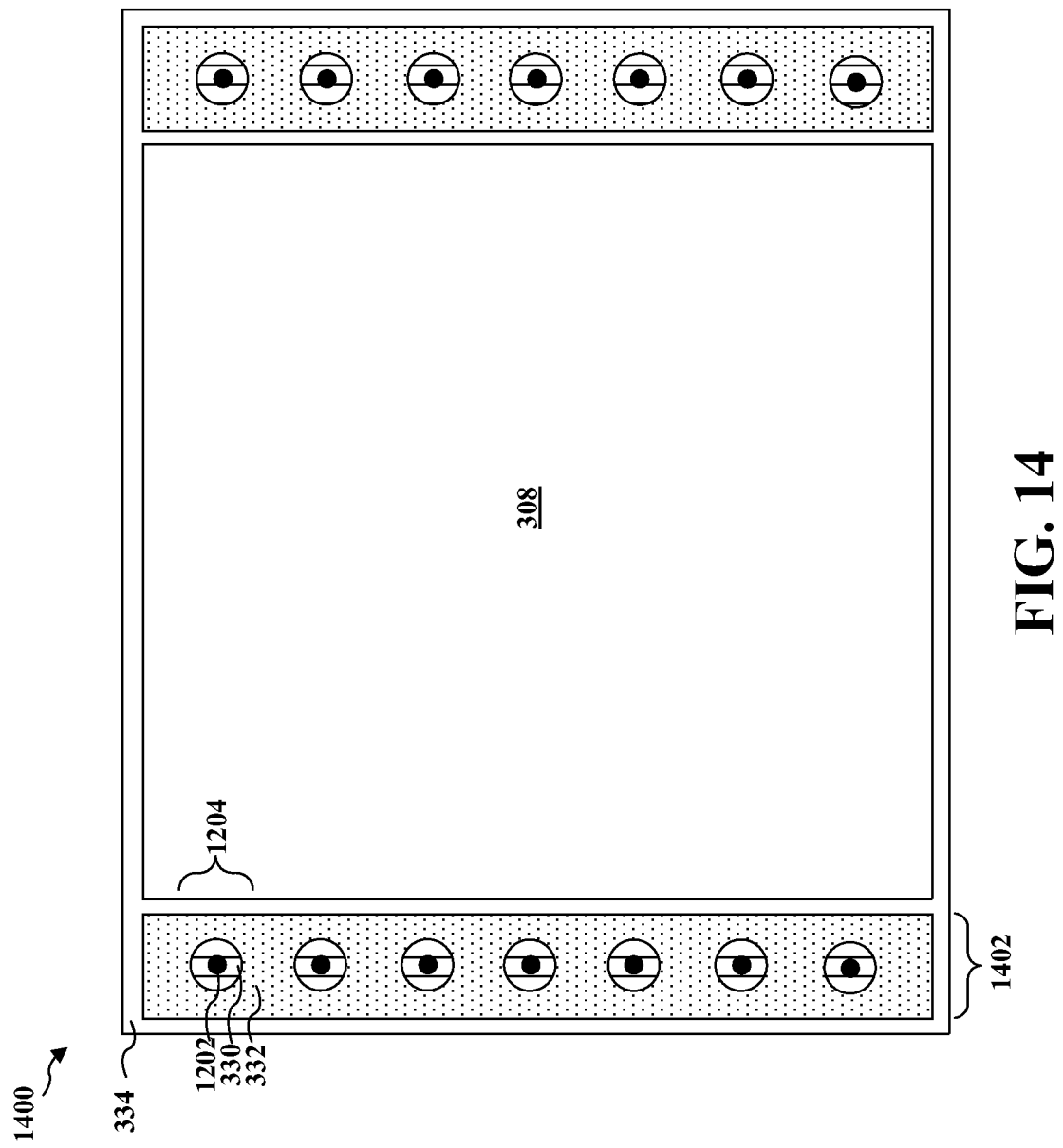
FIG. 14 illustrates a top cross-sectional view of the third exemplary integrated device.

Exemplary Sequence for Providing/Fabricating Exemplary Coaxial Connections in a Third Exemplary Integrated Device FIG. 12 illustrates an exemplary sequence 1200 for providing/fabricating exemplary coaxial connections in a third exemplary integrated device (e.g., the integrated device 1400 illustrated in FIG. 14). The sequence 1200 may include various stages. In some implementations, several stages may be represented as a single stage. One of ordinary skill in the art will understand that the order of some of the stages illustrated in FIG. 12 may be changed without deviating from the scope of the present disclosure. Detailed descriptions of various elements mentioned infra are provided supra and therefore will not be repeated.

Stage 1 of FIG. 12 illustrates a state after an interconnect (e.g., the second interconnect 332) is provided. The second interconnect 332 may include one or more holes 802.

Stage 2 illustrates a state after another interconnect (e.g., the first interconnect 1202) is provided on a substrate (e.g., the substrate 306). In some implementations, the interconnect 1202 is a wire bond. The first interconnect 1202 may be provided above (e.g., on top of) the substrate 306 using a wire-bonding process. Various types of wire-bonding may be implemented without deviating from the scope of the present disclosure. For example, "wire-bonding" may refer to ball bonding, wedge bonding, and/or compliant bonding. The wire-bonding process may produce a round end of the first interconnect 1202 (e.g., a solder ball-like portion at the bottom end of the first interconnect 1202) and a vertical portion extending above the round end. Although this example refers to a wire-bonding process, one of ordinary skill in the art will understand that various other techniques may be used to provide the first interconnect 1202 above the substrate 306 without deviating from the scope of the present disclosure.

Stage 3 illustrates a state after the second interconnect 332 is provided above (e.g., on top of) the substrate 306 such that the first interconnects 1202 are placed through/inside the holes 802 of the second interconnect 332. Afterwards, at least some space 804 may exist between the first interconnect 1202 and the second interconnect 332.

Stage 4 illustrates a state after a dielectric material 330 is provided in the space 804 between the first interconnect 328 and the second interconnect 332. The exemplary coaxial connection 1204 includes the first interconnect 1202, the insulation material 330, and the second interconnect 332. In some implementations, the coaxial connection 1204 may includes several first interconnects.

Stage 5 illustrates a state after a mold 334 (e.g., an encapsulation mold) is provided. The mold 334 may surround (at least) a portion of the second interconnect 332. The mold 334 may provide structural/mechanical support to the first interconnect 1202, the insulation material 330, and/or the second interconnect 332.

In some implementations, at least one or more of the first interconnects (e.g., interconnects 1202) surrounded by the insulation material 804 are inner interconnects of a coaxial interconnect/an interconnect means (e.g., coaxial interconnect means). In some implementations, the second interconnect 332 is an outer interconnect of a coaxial interconnect/an interconnect means (e.g., coaxial interconnect means). In some implementations, the one or more inner interconnects provide a first electrical path for a power signal, and the outer interconnect provide a second electrical path for a ground signal. In some implementations, the combination of at least one or more of the first interconnects (e.g., interconnects 1202), the insulation material 804, and/or the second interconnect 332 are configured to operate as a coaxial interconnect/an interconnect means (e.g., coaxial interconnect means).

Figure 13:
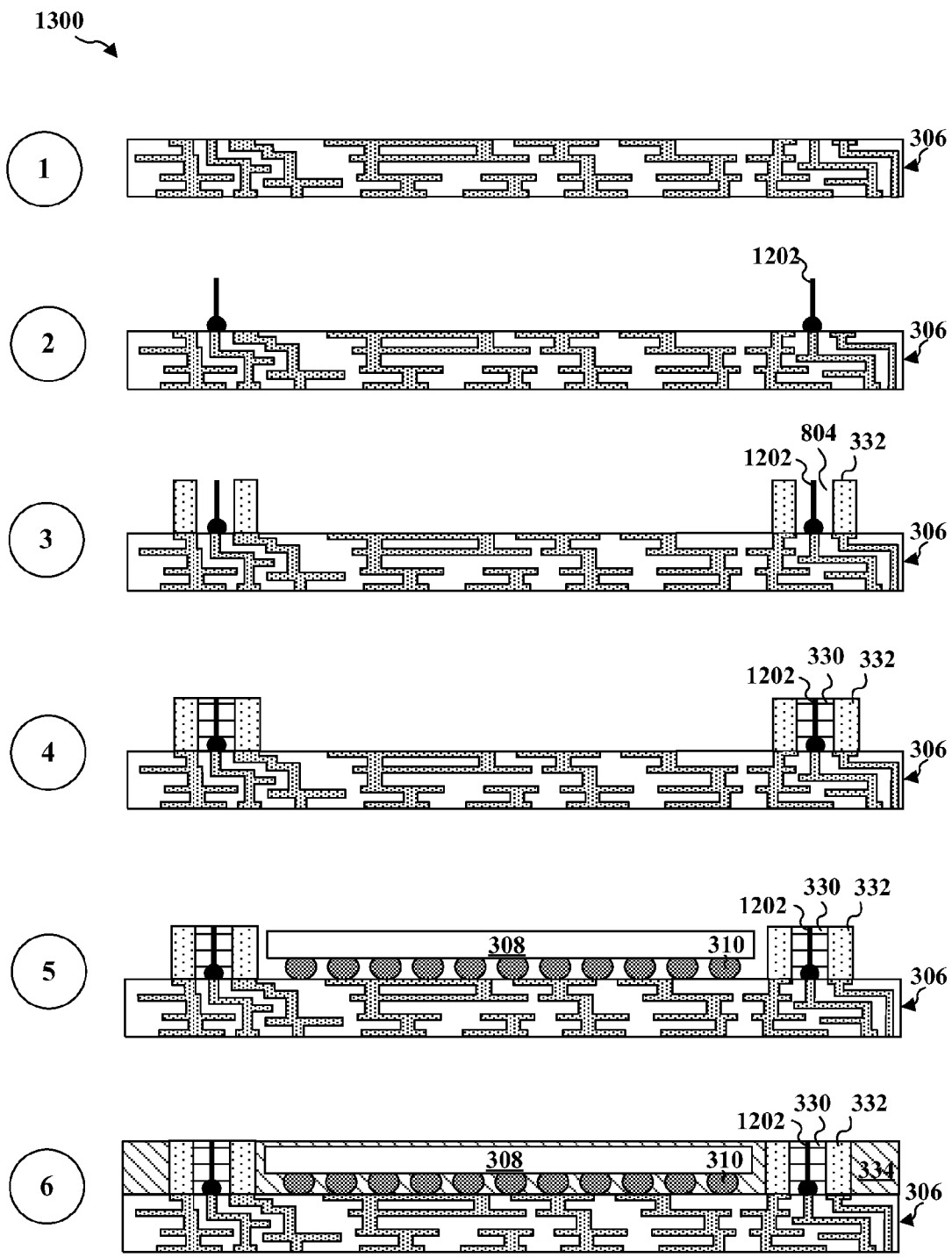
FIG. 13 illustrates an exemplary sequence for providing/fabricating the third exemplary integrated device.

Exemplary Sequence for Providing/Fabricating Third and Fourth Exemplary Integrated Devices FIG. 13 illustrates an exemplary sequence 1300 for providing/fabricating the third exemplary integrated device (e.g., the integrated device 1400 illustrated in FIG. 14). The sequence 1300 may include various stages. One of ordinary skill in the art will understand that the order of some of the stages illustrated in FIG. 13 may be changed without deviating from the scope of the present disclosure. Detailed descriptions of various elements mentioned infra are provided supra and therefore will not be repeated.

Stage 1 of FIG. 13 illustrates a state after a substrate (e.g., substrate 306) is provided. The substrate may include dielectric layers and one or more interconnects (e.g., traces, vias, pads).

Stage 2 illustrates a state after an interconnect (e.g., the first interconnect 1202) is provided above (e.g., on top of) the substrate 306 using a wire-bonding process, as described in greater detail supra.). In some implementations, the interconnect 1202 is a wire bond. One of ordinary skill in the art will understand that various techniques may be used to provide the first interconnect 1202 above the substrate 306 without deviating from the scope of the present disclosure.

Stage 3 illustrates a state after another interconnect (e.g., the second interconnect 332) is provided above (e.g., on top of) the substrate 306. The second interconnect 332 may be a metal plate with holes. At least some space 804 may exist between the first interconnect 1202 and the second interconnect 332.

Stage 4 illustrates a state after a dielectric material 330 is provided in the space 804 between the first interconnect 1202 and the second interconnect 332.

Stage 5 illustrates a state after a die 308 is provided (e., coupled) to the substrate. As shown in stage 5, the die 308 is coupled to a set of solder balls 310. The set of solder balls 310 are coupled to the interconnects of the substrate 306. The die 308 may form an electrical connection with the set of solder balls 310 and interconnects of the substrate 306.

Stage 6 illustrates a state after a mold 334 (e.g., an encapsulation mold) may be provided. The mold 334 may surround (at least) a portion of the second interconnect 332. The mold 334 may provide structural/mechanical support to the first interconnect 328, the second interconnect 1202, the dielectric material 330, the set of solder balls 310, and/or the die 308.

In some implementations, at least one or more of the first interconnects (e.g., interconnects 1202) surrounded by the insulation material 804 are inner interconnects of a coaxial interconnect/an interconnect means (e.g., coaxial interconnect means). In some implementations, the second interconnect 332 is an outer interconnect of a coaxial interconnect/an interconnect means (e.g., coaxial interconnect means). In some implementations, the one or more inner interconnects provide a first electrical path for a power signal, and the outer interconnect provide a second electrical path for a ground signal. In some implementations, the combination of at least one or more of the first interconnects (e.g., interconnects 1202), the insulation material 804, and/or the second interconnect 332 are configured to operate as a coaxial interconnect/an interconnect means (e.g., coaxial interconnect means).

In some implementations, the interconnect 332 and/or an interconnect in the substrate 306 are part of a first netlist for a power distribution network (PDN) of the integrated device. For example, the interconnect 332 and/or an interconnect in the substrate 306 may be part of a ground netlist for a PDN of the integrated device.

In some implementations, the interconnect 1202 and/or another interconnect in the substrate 306 are part of a second netlist for a power distribution network (PDN) of the integrated device. For example, the interconnect 1202 and/or another interconnect in the substrate 306 may be part of a power netlist or data signal netlist for a PDN of the integrated device.

In some implementations, at least some of the interconnects 1202 (e.g., wire bond) may be part of the same netlist of a PDN. In some implementations, at least some of the interconnects 1202 (e.g., wire bond) may be part of the same netlist of a PDN.

FIG. 14 illustrates a top cross-sectional view of the third exemplary integrated device 1400. The third exemplary integrated device 1400 may include one or more coaxial connections 1204 in a row 1402 on one or more sides of the die 308. Each coaxial connection 1204 may include a first interconnect 1202, a second interconnect 332 surrounding the first interconnect 1202, and an insulation material 330 between the first interconnect 1202 and the second interconnect 332. The row 1402 of coaxial connection(s) 1204 may be surrounded by the mold 334. Detailed descriptions of various elements mentioned supra have already been provided herein and therefore will not be repeated.

Figure 15:
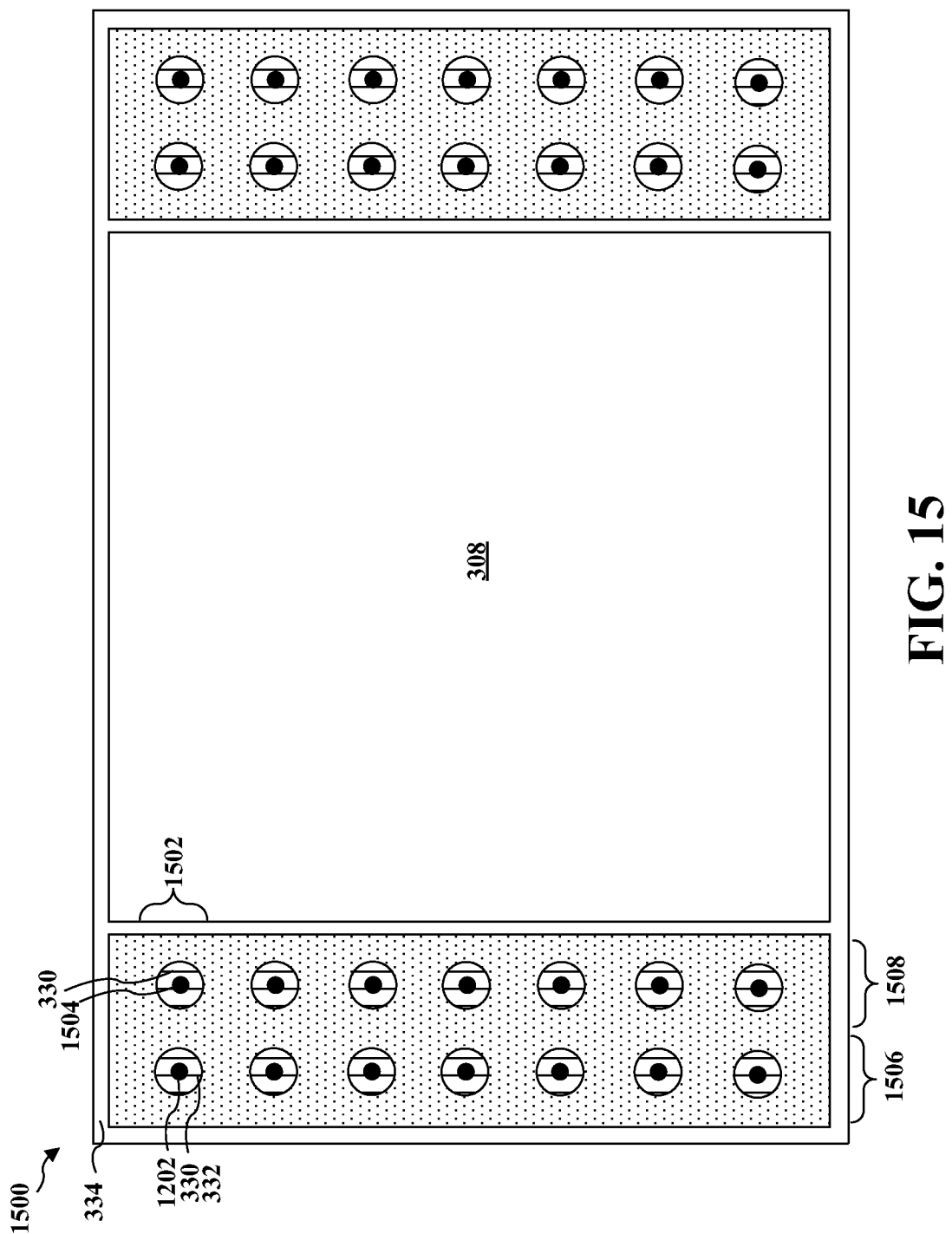
FIG. 15 illustrates a top cross-sectional perspective view of a fourth exemplary integrated device.

FIG. 15 illustrates a top cross-sectional view of a fourth exemplary integrated device 1500. The fourth exemplary integrated device 1500 may include one or more sets of coaxial connections 1502 in rows 1506, 1508 on one or more sides of the die 308. Each coaxial connection 1502 may include first interconnects 1202, 1504, a second interconnect 332 surrounding the first interconnects 1202, 1504, and an insulation material 330 between the first interconnects 1202, 1504 and the second interconnect 332. The rows 1506, 1508 of coaxial connection(s) 1502 may be surrounded by the mold 334. Detailed descriptions of various elements mentioned supra have already been provided herein and therefore will not be repeated.

Figure 16:
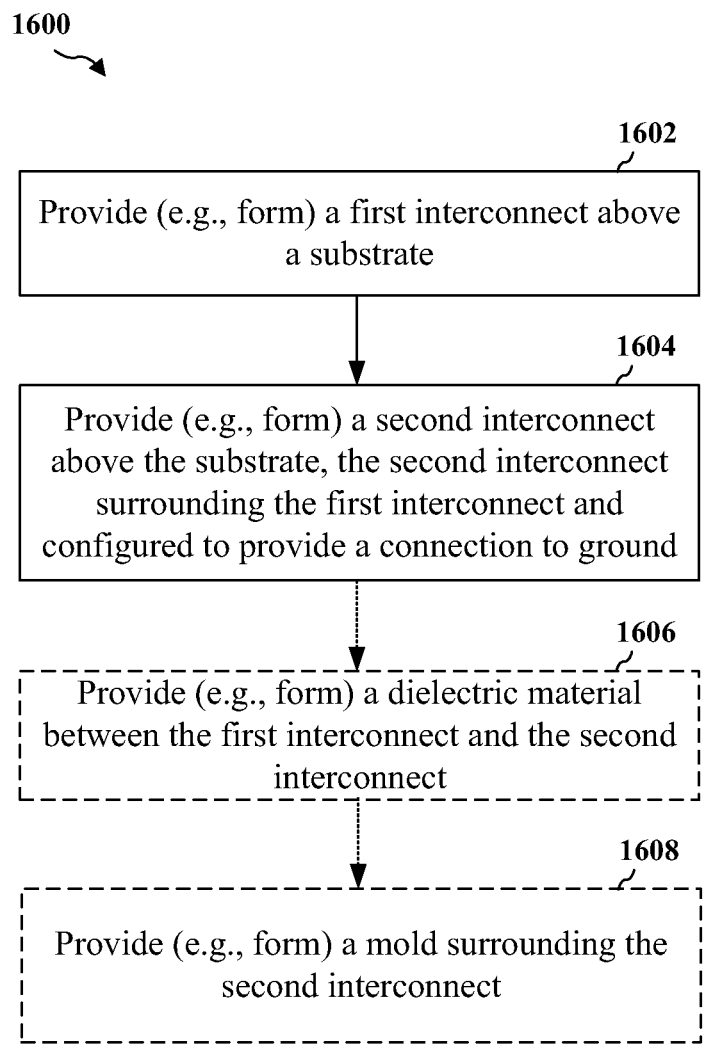
FIG. 16 illustrates an exemplary flow diagram of a method for providing/fabricating an integrated device.

Exemplary Methods for Providing/Fabricating an Integrated Device Including a Coaxial Connection FIG. 16 illustrates an exemplary flow diagram of exemplary methods for providing/fabricating an integrated device including a coaxial connection. The exemplary methods may provide/fabricate any one or more of the integrated devices illustrated supra. One of ordinary skill in the art will understand that the order of some of the blocks illustrated in FIG. 16 may be changed without deviating from the scope of the present disclosure. Also, one of ordinary skill in the art will also understand that any one or more of the blocks illustrated in FIG. 16 may be combined without deviating from the scope of the present disclosure. Optional blocks are illustrated in dashed lines. Detailed descriptions of various elements mentioned infra are provided supra and therefore will not be repeated. The exemplary methods described herein may be performed by an apparatus (e.g., a manufacturing device).

At block 1602, the apparatus may provide (e.g., form) a first interconnect above (e.g., on top of) a substrate. For example, referring to stage 2 in FIG. 8, the first interconnect 328 may be provided (e.g., formed) on the substrate 306. As described in greater detail supra, the first interconnect 328 may be provided (e.g., formed) on the substrate 306 using various techniques. An example of such a technique is a plating process, as described in greater detail supra. Accordingly, the providing of the first interconnect above the substrate may include plating the first interconnect 328 on the substrate 306 (see e.g., FIG. 8). Another example of such a technique is a wire-bonding process, as described in greater detail supra. Accordingly, the providing of the first interconnect above the substrate may include wire-bonding the first interconnect 1202 on the substrate 306 (see e.g., FIG. 12). Alternative techniques for providing a first interconnect on a substrate are known to one of ordinary skill in the art and therefore are within the scope of the present disclosure.

At block 1604, the apparatus may provide (e.g., form) a second interconnect above the substrate. The second substrate may surround the first interconnect and be configured to provide a connection to ground. For example, referring to stage 3 in FIG. 8, the apparatus may provide (e.g., form) the second interconnect 332 on the substrate 306. In some configurations, the second interconnect 332 may be a metal plate including holes 802. The first interconnects 328 may be provided (e.g., positioned) inside/through the holes 802 of the second interconnect 332. As illustrated in FIGS. 7A, 7C, the second interconnect 332 surrounds the first interconnect 328. The second interconnect 332 may be configured to provide an electrical connection to ground.

At block 1606, the apparatus may provide (e.g., form) a dielectric material between the first interconnect and the second interconnect. For example, referring (again) to stage 3 in FIG. 8, at least some space 804 may exist between the first interconnect 328 and the second interconnect 332. The dielectric material 330 may be provided (e.g., formed) into the space 804 between the first interconnect 328 and the second interconnect 332, as illustrated in stage 4 in FIG. 8.

At block 1608, the apparatus may provide (e.g., form) an encapsulation mold surrounding the second interconnect. For example, referring to stage 5 in FIG. 8, the mold 334 may be provided (e.g., formed) surrounding the second interconnect 332. The mold 334 may provide mechanical and/or structural support to the first interconnect 328, the second interconnect 332 surrounding the first interconnect 328, and/or the insulation material 330 between the first interconnect 328 and the second interconnect 332.

Exemplary Electronic Devices

FIG. 17 illustrates various electronic devices that may be integrated with any of the aforementioned integrated device, semiconductor device, integrated circuit, die, interposer and/or package. For example, a mobile telephone 1702, a laptop computer 1704, and a fixed location terminal 1706 may include an integrated device 1700 described herein. The integrated device 1700 may be, for example, any of the integrated circuits, dies, interposer, or packages described herein. The devices 1702, 1704, 1706 illustrated in FIG. 17 are merely exemplary. Other electronic devices may also feature the integrated device 1700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof One or more of the components, steps, features, and/or functions illustrated in FIGS. 3, 4, 5, 6, 7A, 7B, 7C, 7D, 8, 9, 10, 11, 12, 13, 14, 15 and/or 16 may be rearranged and/or combined into a single component, step, feature or function or embodied in several components, steps, or functions. Additional elements, components, steps, and/or functions may also be added without departing from the disclosure. FIGS. 3, 4, 5, 6, 7A, 7B, 7C, 7D, 8, 9, 10, 11, 12, 13, 14, 15 and/or 16 and its corresponding description in the present disclosure are not limited to dies and/or (integrated circuits) IC. In some implementations, FIGS. 3, 4, 5, 6, 7A, 7B, 7C, 7D, 8, 9, 10, 11, 12, 13, 14, 15 and/or 16 and its corresponding description may be used to manufacture, create, provide, and/or produce integrated devices. In some implementations, an integrated device may include a die package, an IC, a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
a first substrate with a first electrical interconnect;
a second substrate with a second electrical interconnect;
an inner interconnect configured to electrically couple to the first electrical interconnect of the first substrate and configured to electrically couple to the second electrical interconnect of the second substrate; and
an outer interconnect surrounding the outer interconnect, the outer interconnect configured to provide an electrical connection to ground.

2. The integrated device of claim 1, wherein the outer interconnect comprises a plate.

3. The integrated device of claim 1, further comprising a dielectric material between the inner interconnect and the outer interconnect.

4. The integrated device of claim 1, further comprising a mold surrounding the outer interconnect.

5. The integrated device of claim 1, wherein the inner interconnect is configured to provide an electrical path for a power signal in a first direction.

6. The integrated device of claim 5, wherein the outer interconnect is configured to provide an electrical path for a grounding signal in a second direction.

7. The integrated device of claim 1, wherein the inner interconnect is one of at least a plated interconnect and/or wire bond.

8. The integrated device of claim 1, wherein the integrated device comprises one of at least an interposer, a package device, and/or a package-on-package (PoP) device.

9. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. An apparatus comprising:
    a first substrate with a first electrical interconnect;
    a second substrate with a second electrical interconnect;
    an inner interconnect means configured to electrically couple to the first electrical interconnect of the first substrate and configured to electrically couple to the second electrical interconnect of the second substrate; and
    an outer interconnect means coupled to one or more of the first substrate and the second substrate, the outer interconnect means configured to provide an electrical connection to ground.

11. The apparatus of claim 10, wherein the outer interconnect means surrounds the inner interconnect means, and wherein the outer interconnect means comprises a plate.

12. The apparatus of claim 11, further comprising a dielectric material between the inner interconnect means and the outer interconnect means.

13. The apparatus of claim 10, further comprising a mold surrounding the outer interconnect means.

14. The apparatus of claim 11, wherein the inner interconnect means is configured to provide an electrical path for a power signal in a first direction.

15. The apparatus of claim 14, wherein the outer interconnect means is configured to provide an electrical path for a grounding signal in a second direction.

16. The apparatus of claim 11, wherein inner interconnect means is one of at least a plated interconnect and/or wire bond.

17. The apparatus of claim 10, wherein the apparatus comprises one of at least an interposer, a package device, and/or a package-on-package (PoP) device.

18. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

19. A method of fabricating an integrated device, the method comprising:
    forming a first substrate with a first electrical interconnect;
    forming a second substrate with a second electrical interconnect;
    forming an inner interconnect electrically coupling the inner interconnect to the first electrical interconnect of the first substrate and electrically coupling the inner interconnect to the second electrical interconnect of the second substrate; and
    providing an outer interconnect, the outer interconnect surrounding the inner interconnect and configured to provide an electrical connection to ground.

20. The method of claim 19, wherein the forming the inner interconnect above the first substrate comprises plating the inner interconnect on the first substrate.

21. The method of claim 19, wherein the forming the inner interconnect above the first substrate comprises wire-bonding the inner interconnect on the first substrate.

22. The method of claim 19, wherein the outer interconnect comprises a plate.

23. The method of claim 19, further comprising forming a dielectric layer between the inner interconnect and the outer interconnect.

24. The method of claim 19, further comprising forming a mold surrounding the outer interconnect.

25. The method of claim 19, wherein the inner interconnect is configured to provide an electrical path for a power signal in a first direction.

26. The method of claim 25, wherein the outer interconnect is configured to provide an electrical path for a grounding signal in a second direction.

27. The method of claim 26, wherein the second direction is different from the first direction.

28. The method of claim 19, wherein the integrated device comprises one of at least an interposer, a package device, and/or a package-on-package (PoP) device.

29. The method of claim 19, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *